US010446451B1

(12) United States Patent
Soss et al.

(10) Patent No.: US 10,446,451 B1
(45) Date of Patent: Oct. 15, 2019

(54) METHOD FOR FORMING REPLACEMENT GATE STRUCTURES FOR VERTICAL TRANSISTORS

(71) Applicant: GLOBALFOUNDRIES Inc., Grand Cayman (KY)

(72) Inventors: Steven Soss, Cornwall, NY (US); Steven Bentley, Menands, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 16/027,834

(22) Filed: Jul. 5, 2018

(51) Int. Cl.
*H01L 21/8238* (2006.01)
*H01L 29/08* (2006.01)
*H01L 21/768* (2006.01)
*H01L 29/66* (2006.01)

(52) U.S. Cl.
CPC ......... *H01L 21/823885* (2013.01); *H01L 21/76829* (2013.01); *H01L 29/0847* (2013.01); *H01L 29/6656* (2013.01); *H01L 29/66545* (2013.01); *H01L 29/66666* (2013.01)

(58) Field of Classification Search
CPC ....... H01L 21/823885; H01L 29/66666; H01L 29/6656; H01L 21/76829; H01L 29/0847; H01L 29/66545
See application file for complete search history.

(56) References Cited

U.S. PATENT DOCUMENTS

| 9,362,355 | B1 | 6/2016 | Cheng et al. |
| 9,704,754 | B1 | 7/2017 | Bao et al. |
| 2006/0091432 | A1* | 5/2006 | Guha ............... H01L 29/78654 257/288 |

* cited by examiner

*Primary Examiner* — Karen Kusumakar
(74) *Attorney, Agent, or Firm* — Amerson Law Firm, PLLC

(57) ABSTRACT

The present disclosure is directed to various embodiments of a method for forming replacement gate structures for vertical transistors. One illustrative method disclosed herein includes, among other things, forming first and second vertical semiconductor structures, forming first and second sacrificial spacers adjacent channel regions of the first and second vertical semiconductor structures, respectively, forming a ring spacer adjacent the first and second sacrificial spacers, removing end portions of the ring spacer to expose end portions of the first and second sacrificial spacers, replacing the first sacrificial spacer with a first replacement gate structure including a first gate insulation layer and a first conductive gate material, replacing the second sacrificial spacer with a second replacement gate structure including a second gate insulation layer and a second conductive gate material, removing remaining portions of the ring spacer to define a spacer cavity, and forming a dielectric material in the spacer cavity.

20 Claims, 11 Drawing Sheets

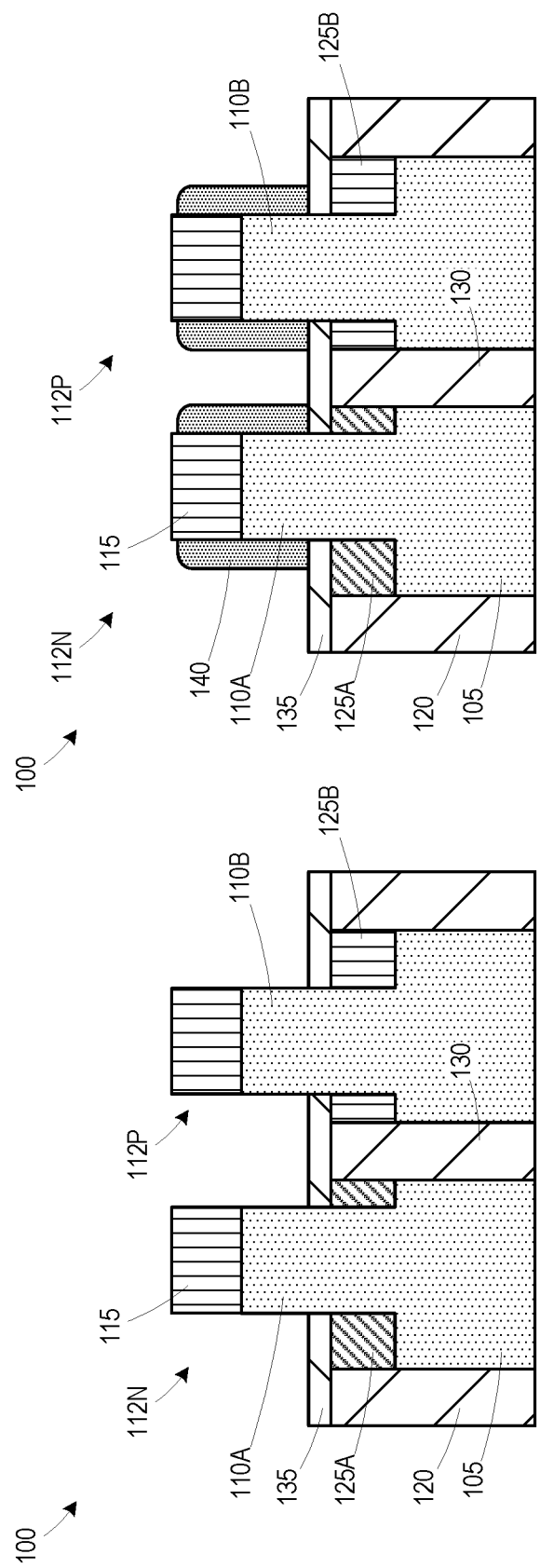

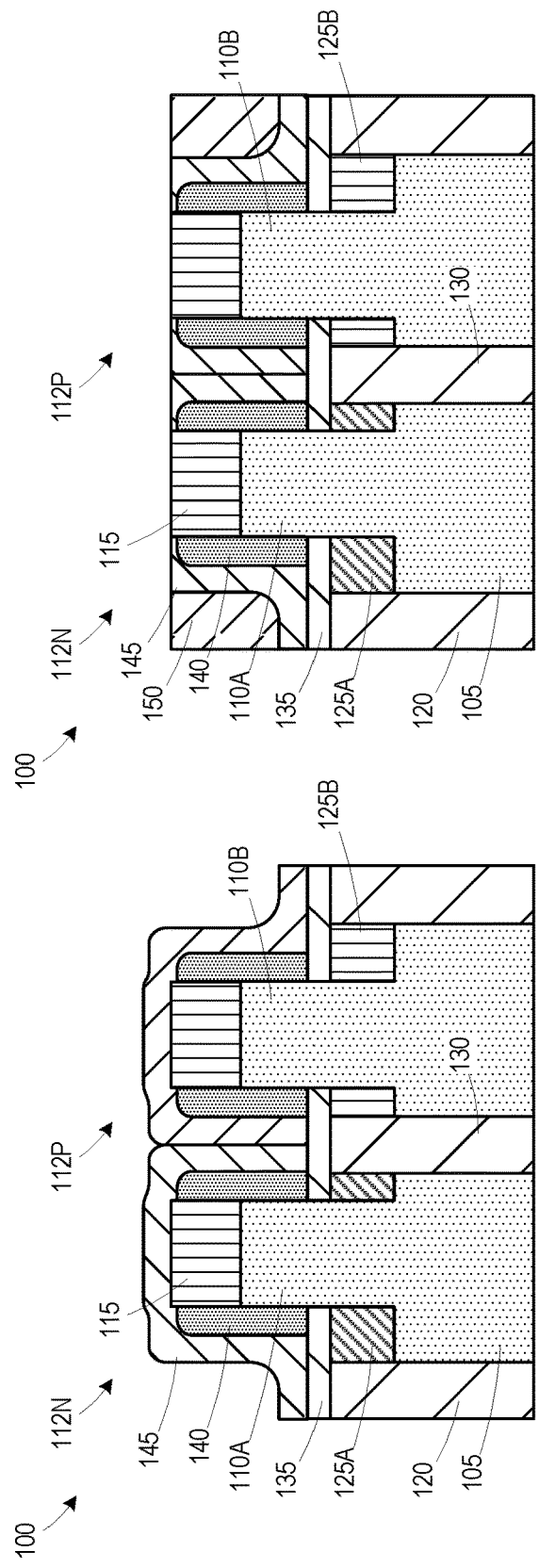

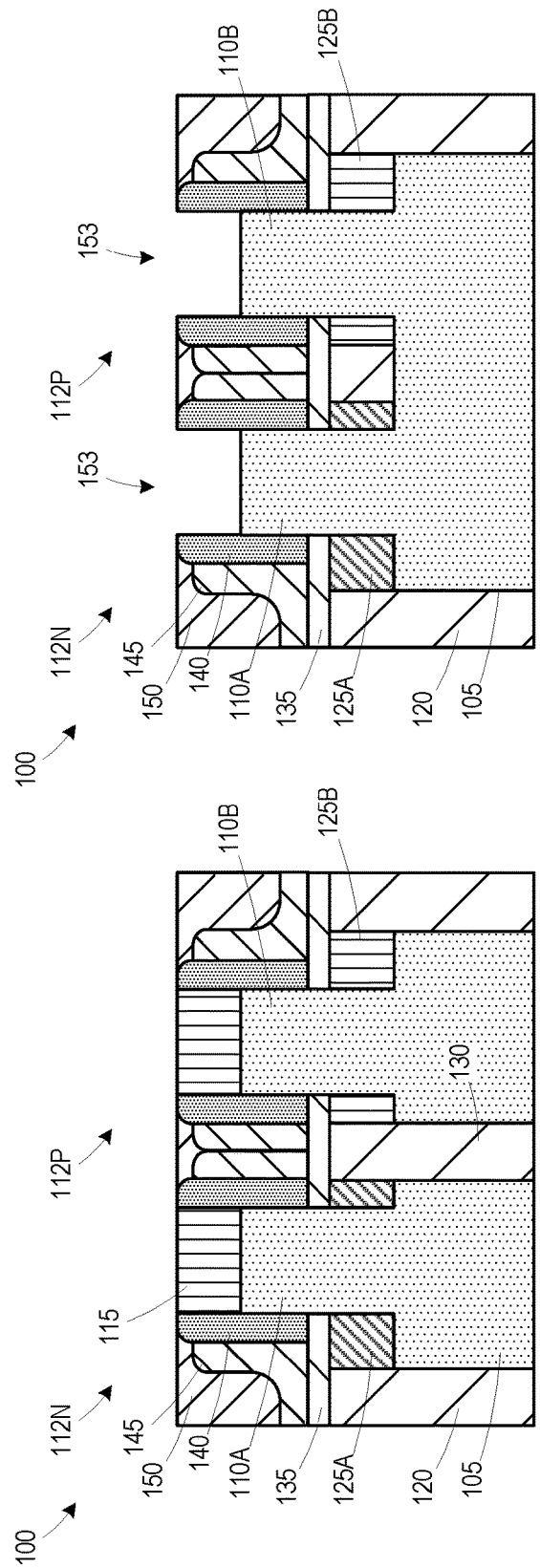

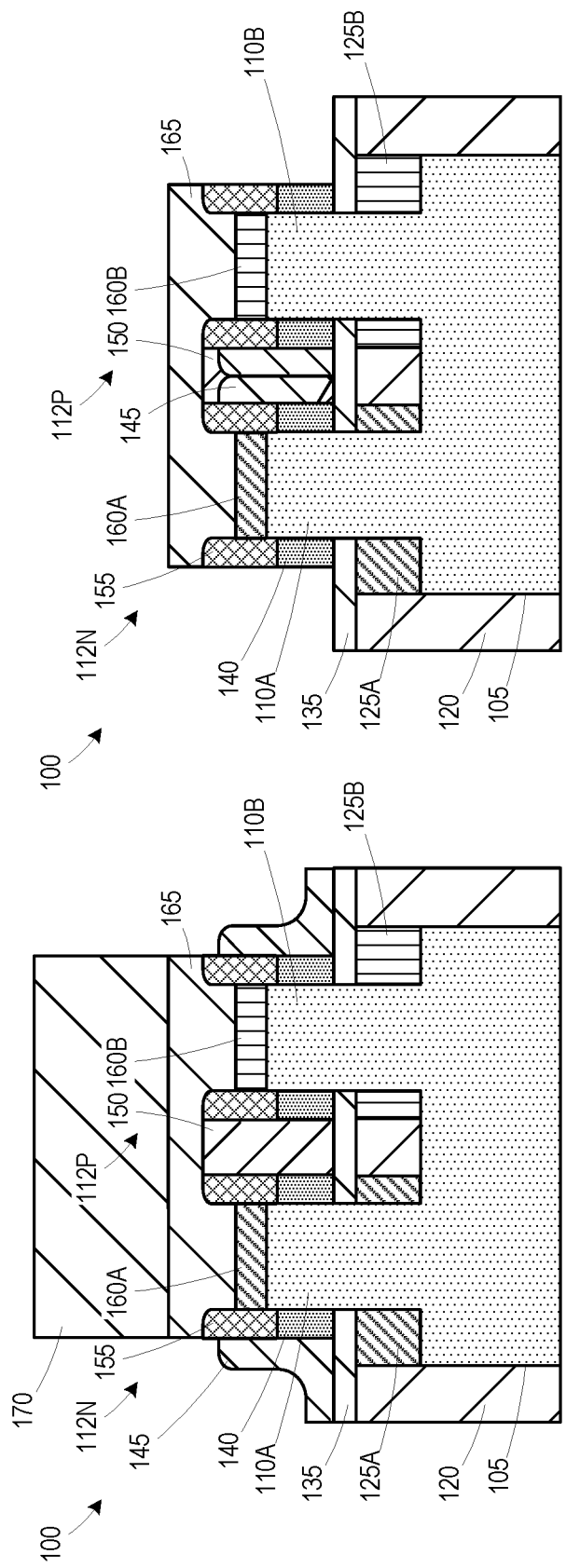

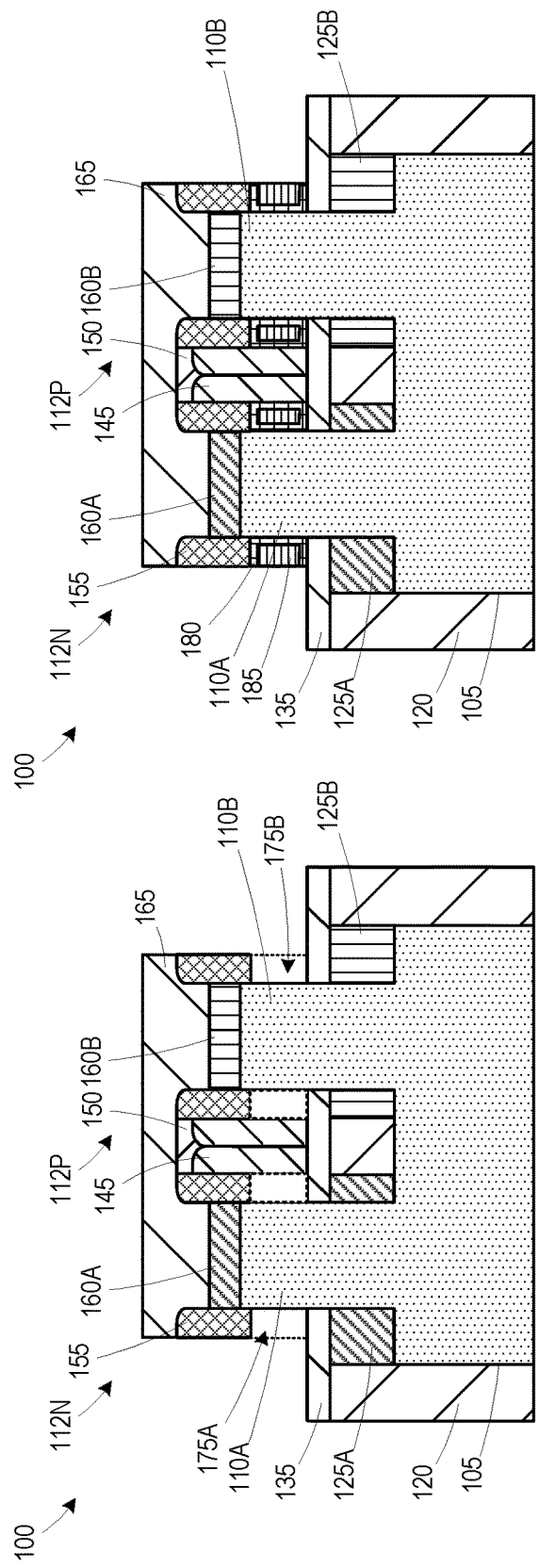

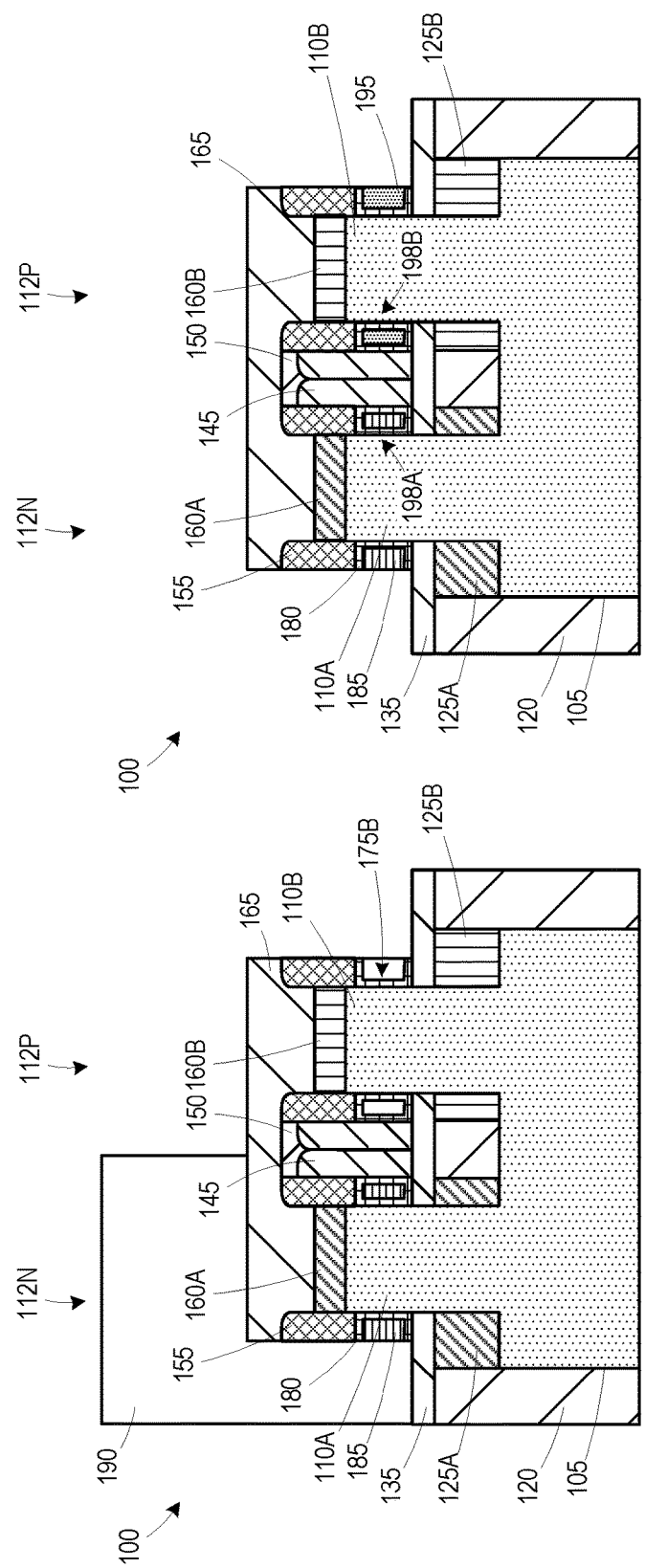

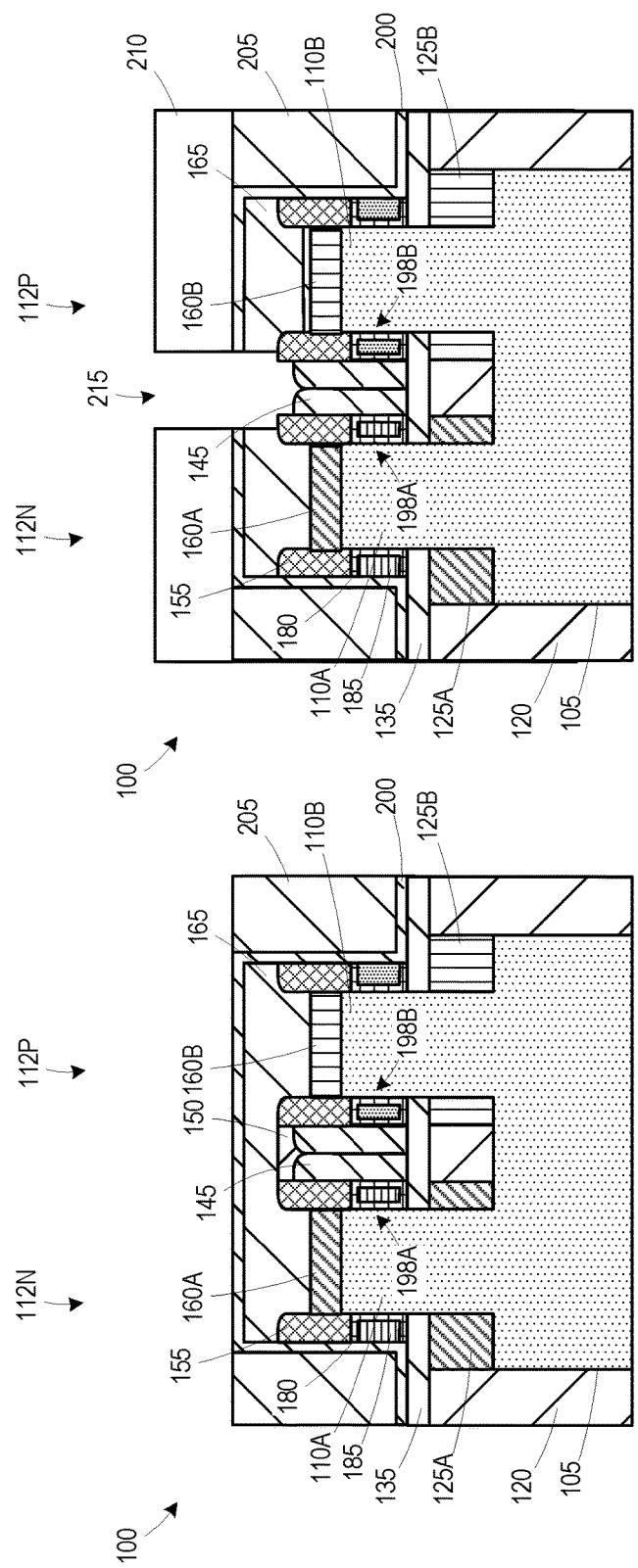

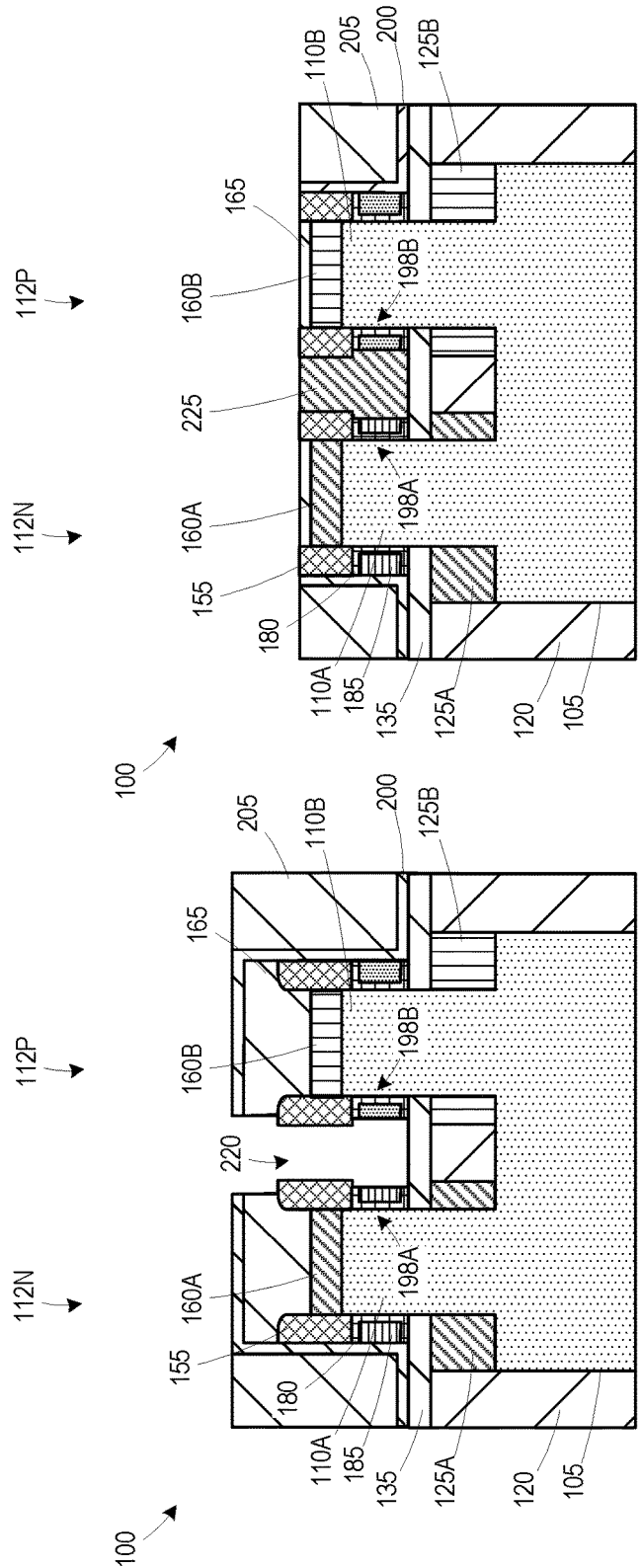

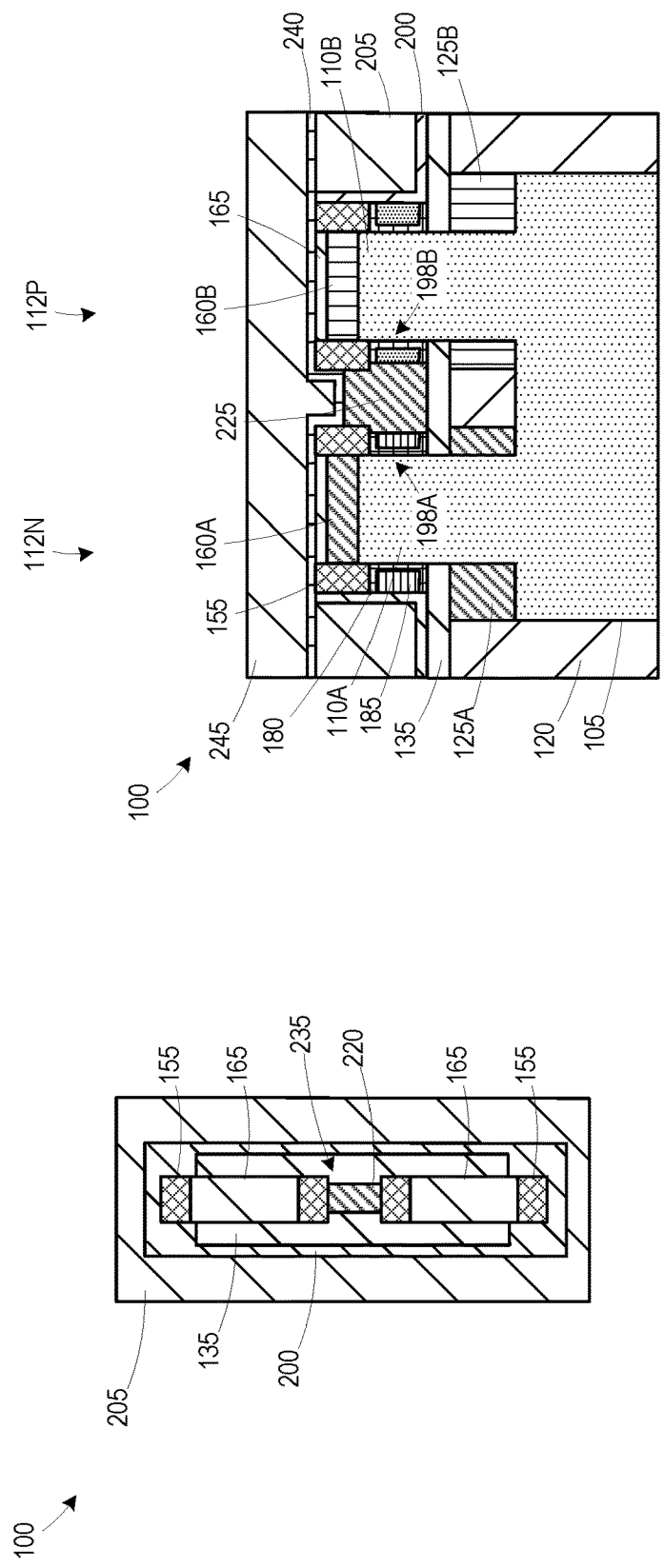

METHOD FOR FORMING REPLACEMENT GATE STRUCTURES FOR VERTICAL TRANSISTORS

BACKGROUND

1. Field of the Disclosure

The present disclosure generally relates to the fabrication of semiconductor devices, and, more particularly, to a method for forming replacement gate structures for vertical transistors.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout. Field effect transistors (NMOS and PMOS transistors) represent one important type of circuit element that substantially determines performance of such integrated circuits. During the fabrication of complex integrated circuits using, for instance, MOS technology, millions of transistors, e.g., NMOS transistors and/or PMOS transistors, are formed on a substrate including a crystalline semiconductor layer. A field effect transistor, whether an NMOS or a PMOS device, is a planar device that typically includes a source region, a drain region, a channel region that is positioned between the source region and the drain region, and a gate structure positioned above the channel region. The gate structure is typically comprised of a very thin gate insulation layer and one or more conductive layers that act as a conductive gate electrode. In a field effect transistor, the conductivity of the channel region, i.e., the drive current capability of the conductive channel, is controlled by applying an appropriate voltage to the gate electrode.

Field effect transistors come in a variety of different configurations, e.g., planar devices, FinFET devices, vertical transistor devices, etc. As technology advances, there is a constant demand to reduce the overall size of the IC products to reduce the size of the consumer products incorporating such IC products. Vertical transistor devices, with their vertically oriented channel structure, present one promising choice for advanced IC products given the potential space savings achieved by using such devices. Modern integrated circuit (IC) products typically include a very large number of active individual circuit elements, such as field effect transistors, as well as numerous passive circuit elements, such as capacitors, resistors and the like. These circuit elements are combined in various arrangements to make integrated circuits that perform a variety of functions so as to enable the IC product to perform its intended function.

To balance the threshold voltages of CMOS devices, different gate materials are typically used for PMOS versus NMOS devices. The gate materials are generally formed using a replacement gate process that replaces a placeholder material with the desired gate materials. Due to the space constraints associated with vertical transistor devices, it is difficult to implement a replacement gate process to form different gate materials.

The present disclosure is directed to various methods and resulting devices that may avoid, or at least reduce, the effects of one or more of the problems identified above.

SUMMARY

The following presents a simplified summary of illustrative embodiments of the invention in order to provide a basic understanding of some aspects of the illustrative embodiments of the invention. This summary is not an exhaustive overview of the illustrative embodiments of the invention specifically discussed herein. It is not intended to identify key or critical elements of the invention or to delineate the scope of the invention. Its sole purpose is to present some concepts in a simplified form as a prelude to the more detailed description that is discussed later.

Generally, the present disclosure is directed to various embodiments of a method for forming replacement gate structures for vertical transistors. One illustrative method disclosed herein includes, among other things, forming first and second vertical semiconductor structures, forming first and second sacrificial spacers adjacent channel regions of the first and second vertical semiconductor structures, respectively, forming a ring spacer adjacent the first and second sacrificial spacers, removing end portions of the ring spacer to expose end portions of the first and second sacrificial spacers, replacing the first sacrificial spacer with a first replacement gate structure including a first gate insulation layer and a first conductive gate material, replacing the second sacrificial spacer with a second replacement gate structure including a second gate insulation layer and a second conductive gate material, removing remaining portions of the ring spacer to define a spacer cavity, and forming a dielectric material in the spacer cavity.

Another illustrative method disclosed herein includes, among other things, forming a first vertical semiconductor structure having a first bottom source/drain region, forming a second vertical semiconductor structure having a second bottom source/drain region, forming a bottom spacer above the first and second bottom source/drain regions, forming first and second sacrificial spacers on sidewalls of the first and second vertical semiconductor structures, respectively, forming a ring spacer adjacent the first and second sacrificial spacers, removing end portions of the ring spacer to expose end portions of the first and second sacrificial spacers, removing the first and second sacrificial spacers through the exposed end portions of the first and second sacrificial spacers to define a first gate cavity adjacent the first vertical semiconductor structure and a second gate cavity adjacent the second vertical semiconductor structure, forming a gate insulation layer in the first and second gate cavities, forming a first conductive gate material in the first and second gate cavities, selectively removing at least a portion of the first conductive gate material from the second gate cavity, forming a second conductive material in the second gate cavity, removing remaining portions of the ring spacer to define a spacer cavity, and forming a dielectric material in the spacer cavity.

BRIEF DESCRIPTION OF THE DRAWINGS

The disclosure may be understood by reference to the following description taken in conjunction with the accompanying drawings, in which like reference numerals identify like elements, and in which:

FIGS. 1-22 are cross-section and top views depicting various methods disclosed herein of forming replacement gate structures for vertical transistors.

Figures 7, 8:
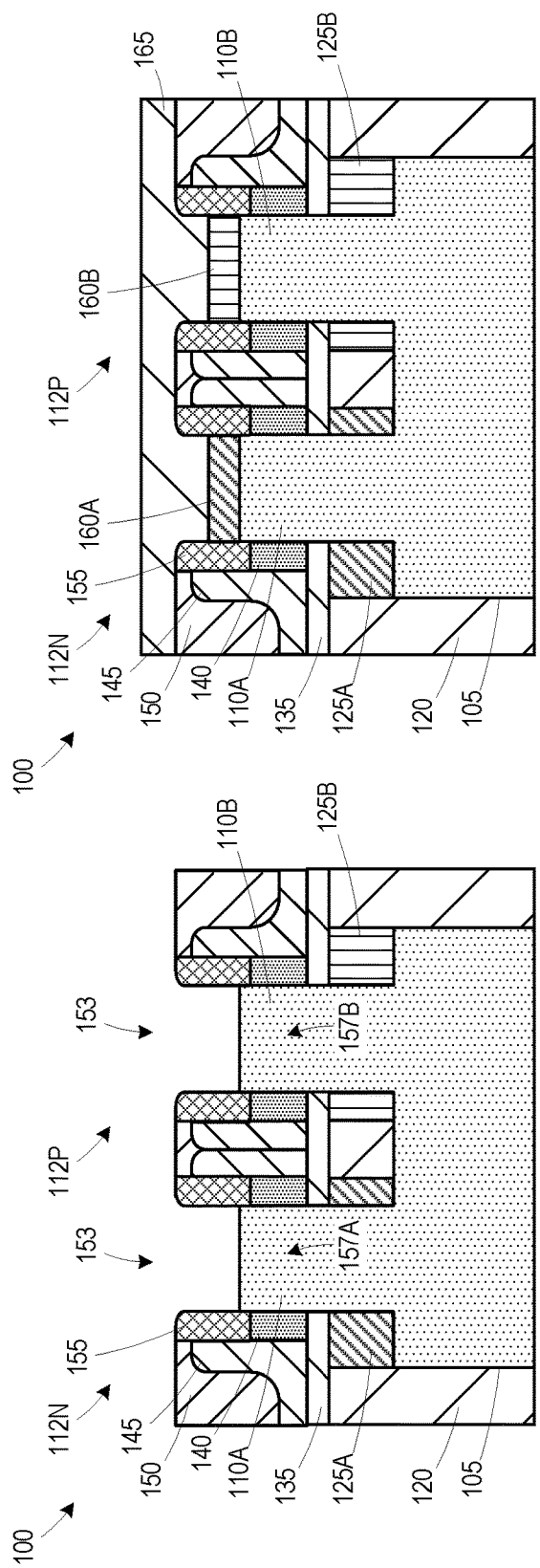

While the subject matter disclosed herein is susceptible to various modifications and alternative forms, specific embodiments thereof have been shown by way of example in the drawings and are herein described in detail. It should be understood, however, that the description herein of specific and illustrative embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase. The various layers of material described below may be formed by any of a variety of different known techniques, e.g., a chemical vapor deposition (CVD) process, an atomic layer deposition (ALD) process, a thermal growth process, epitaxial growth processes, spin-coating techniques, etc. Moreover, as used herein and in the attached claims, the word "adjacent" is to be given a broad interpretation and should be interpreted to cover situations where one feature actually contacts another feature or is in close proximity to that other feature.

FIGS. 1-22 depict the various embodiments of a method for forming replacement gate structures for vertical transistors in an integrated circuit device 100 formed on a substrate 105. FIG. 1 shows a cross-sectional view of the device 100 along the axial length of two adjacent illustrative fins 110A, 110B. In the illustrative embodiment, the fin 110A is part of a vertical N-type transistor 112N, and the fin 110B is part of a vertical P-type transistor 112P. The N-type transistor 112N and the vertical P-type transistor 112P cooperate to define an inverter, which is a foundational element in a memory cell. Of course, the methods described herein may be applied to other circuit elements. A hard mask layer 115 (e.g., a stack including a layer of silicon dioxide and a layer of silicon nitride) was formed above the substrate 105 and patterned to define fin openings forming the fins 110A, 110B.

The fins 110A, 110B were formed within an active region bounded by an isolation structure 120 (e.g., silicon dioxide). Bottom source/drain regions 125A, 125B doped according to the type of the transistor were formed at the base of the fins 110A, 110B. An isolation break 130 was formed to separate the bottom source/drain regions 125A, 125B disposed between the fins 110A, 110B. A bottom spacer 135 (e.g., silicon dioxide) was formed above the bottom source/drain regions 125A, 125B.

The substrate 105 may have a variety of forms, such as the bulk substrate illustrated. The substrate 105 may also have a silicon-on-insulator (SOI) configuration that includes a bulk silicon layer, a buried insulation layer and an active layer, wherein semiconductor devices are formed in and above the active layer. The substrate 105 may be formed of silicon or silicon germanium or it may be made of materials other than silicon, such as germanium. Thus, the terms "substrate" or "semiconductor substrate" should be understood to cover all semiconducting materials and all forms of such materials. The substrate 105 may have different layers. For example, the fins 110A, 110B may be formed in a process layer formed above the base layer of the substrate 105. In general, the fins 110A, 110B represent vertically oriented semiconductor structures. Other vertical structures may be employed, such as pillars.

FIG. 2 illustrates the product 100 after several processes were performed to define sacrificial spacers 140 (e.g., low temperature oxide (LTO)) around the fins 110A, 110B. A deposition process was performed to form a layer of spacer material, and an anisotropic etch process was performed to remove horizontal portions of the layer of spacer material, leaving the sacrificial spacers 140. The sacrificial spacers 140 serve as placeholders for the subsequently formed gate structures.

FIG. 3 illustrates the product 100 after several processes were performed. Processes similar to those described in reference to FIG. 2 were performed to define ring spacers 145 (e.g., amorphous silicon) around and above the sacrificial spacers 140. The ring spacers 145 merge in the region between the fins 110A, 110B. The ring spacers 145 allow independent access to the sacrificial spacers 140 for a replacement gate process described in greater detail below.

FIG. 4 illustrates the product 100 after a deposition process was performed to form a dielectric layer 150 adjacent the fins 110A, 110B. A planarization process was performed to planarize the dielectric layer 150 and expose the hard mask layer 115 and the ring spacers 145.

FIG. 5 illustrates the product 100 after several process were performed. An etch process was performed to selectively recess the ring spacers 145. A deposition process was performed to fill in the recessed regions formed in the dielectric layer 150, and another planarization process was performed to re-planarize the dielectric layer 150 and expose the hard mask layer 115 and the sacrificial spacers 140.

FIG. 6 illustrates the product 100 after a selective etch process was performed to remove the hard mask layer 115 to define cap cavities 153.

FIG. 7 illustrates the product 100 after several processes were performed. A selective etch process was performed to recess the sacrificial spacers 140. The sacrificial spacers 140 are recessed to a height corresponding a channel length of the transistors 112N, 112P. Processes similar to those described in reference to FIG. 2 were performed to define inner spacers 155 (e.g., silicon nitride) above the recessed sacrificial spacers 140. Thus, the sacrificial spacers 140 are positioned adjacent channel regions 157A, 157B of the fins 110A, 110B.

FIG. 8 illustrates the product 100 after several processes were performed. Epitaxial growth processes were performed (i.e., using masks) to formed doped epitaxial material for top source/drain regions 160A, 160B. A deposition process was performed to form a cap layer 165 (e.g., silicon nitride) above the top source/drain regions 160A, 160B and above the dielectric layer 150.

FIG. 9 illustrates the product 100 after a mask 170 was formed to cover the fins 110A, 110B, while leaving regions above end portions of the ring spacers 145 uncovered. One or more etch processes were performed to etch the cap layer 165 and the dielectric layer 150 to expose the ends of the ring spacers 145.

FIG. 10 illustrates the product 100 after one or more selective etch processes were performed to remove exposed portions of the ring spacers 145 and to remove the mask layer 170. The removal of the ring spacers 145 exposes the sacrificial spacers 140.

FIG. 11 illustrates the product 100 after a wet etch process was performed to remove the sacrificial spacers 140 to define gate cavities 175A, 175B that surround the respective fins 110A, 110B. The gate cavities 175A, 175B are bounded by remaining portions of the ring spacers 145.

FIG. 12 illustrates the product 100 after several processes were performed. A deposition process was performed to form gate insulation layer 180 (e.g., high-k material, such as hafnium oxide) in the gate cavities 175A, 175B. One or more deposition processes were performed to form a first work function material (WFM) layer 185 (e.g., conductive gate material) over the gate insulation layer 180 in the gate cavities 175A, 175B and to overfill the gate cavities 175A, 175B. An etch process was performed to remove portions of the WFM layer 185 and the gate insulation layer 180 not disposed in the gate cavities 175A, 175B. The WFM layer 185 may be a single material or a stack of different layers. An example WFM material for a N-type device includes TiN.

FIG. 13 illustrates the product 100 after a patterned mask 190 (e.g., organic patterning layer (OPL)) was formed above the transistor 112N, thereby covering the WFM layer 185 in the gate cavity 175A and exposing the WFM layer 185 in the gate cavity 175B. A selective wet etch process was performed to remove the WFM layer 185 from the gate cavity 175B, thereby reopening the gate cavity 175B.

FIG. 14 illustrates the product 100 after several processes were performed. The mask 190 was stripped. One or more deposition processes were performed to form a second work function material (WFM) layer 195 (e.g., conductive gate material) over the gate insulation layer 180 in the gate cavity 175B and to overfill the gate cavity 175B. An etch process was performed to remove portions of the WFM layer 195 not disposed in the gate cavity 175B. The WFM layer 195 may be a single material or a stack of different layers. An example WFM material for an N-type device include a stack of layers, such as TiN/TiC/TiN. In some embodiments, the removal of the remaining portions of the gate insulation layer 180 may occur after the forming and removal of excess portions of the second WFM layer 195. The gate insulation layer 180 and the WFM layers 185, 195, define gate structures 198A, 198B, respectively.

FIG. 15 illustrates the product 100 after a first deposition process was performed to form a liner layer 200 (e.g., low-k dielectric) and a second deposition process was performed to form a dielectric layer 205 above the liner layer 200. A planarization process was performed to remove portions of the dielectric layer 205 above the transistors 112N, 112P.

FIG. 16 illustrates the product 100 after a patterned mask layer 210 was formed above the liner layer 200. The mask layer 210 has an opening 215 positioned above the center portion of the ring spacer 145 disposed between the gate structures 198A, 198B. One or more etch processes were performed to remove the portions of the liner layer 200, the cap layer 165, and the dielectric layer 150 to expose the ring spacer 145.

FIG. 17 illustrates the product 100 after several processes were performed. A strip process was performed to remove the mask layer 210. An anisotropic etch process was performed through the opening 215 to remove a portion of the ring spacer 145 between the gate structures 198A, 198B to define a contact cavity 220. An etch process was performed to remove portions of the gate insulation layer 180 exposed by the contact cavity 220.

Figure 19:
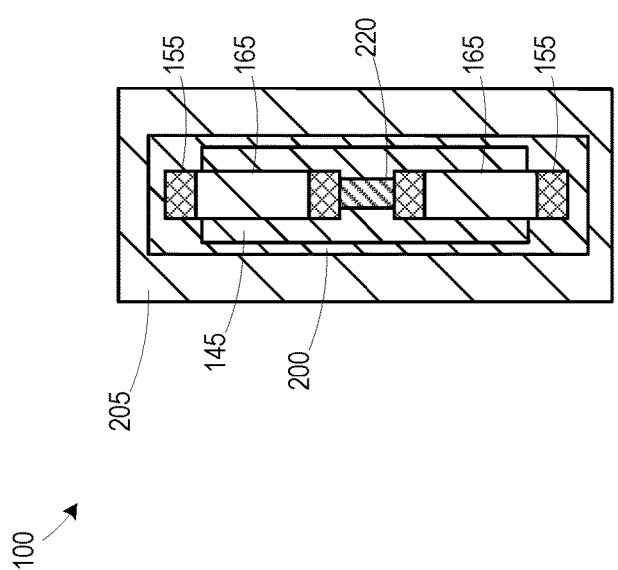

FIGS. 18 and 19 illustrate the product 100 after several processes were performed. One or more deposition processes were performed to deposit a conductive material in the contact cavity 220 to define a gate plug 225 that conductively couples the gate structures 198A, 198B, thereby forming a shared gate structure. The gate plug 225 may include a liner material (e.g., Ti) and a fill material (e.g., tungsten). A planarization process was performed to remove excess portions of the conductive material outside the contact cavity 220 and to remove portions of the liner layer 200, and the dielectric layer 205, to expose remaining portions of the ring spacers 145. The ring spacers 145 are not visible in the cross-section of FIG. 18, as they are positioned in front of and behind the fins 110A, 110B. FIG. 19 is a top view of the product 100 illustrating the remaining portions of the ring spacers 145 after the planarization process was performed.

Figure 20:
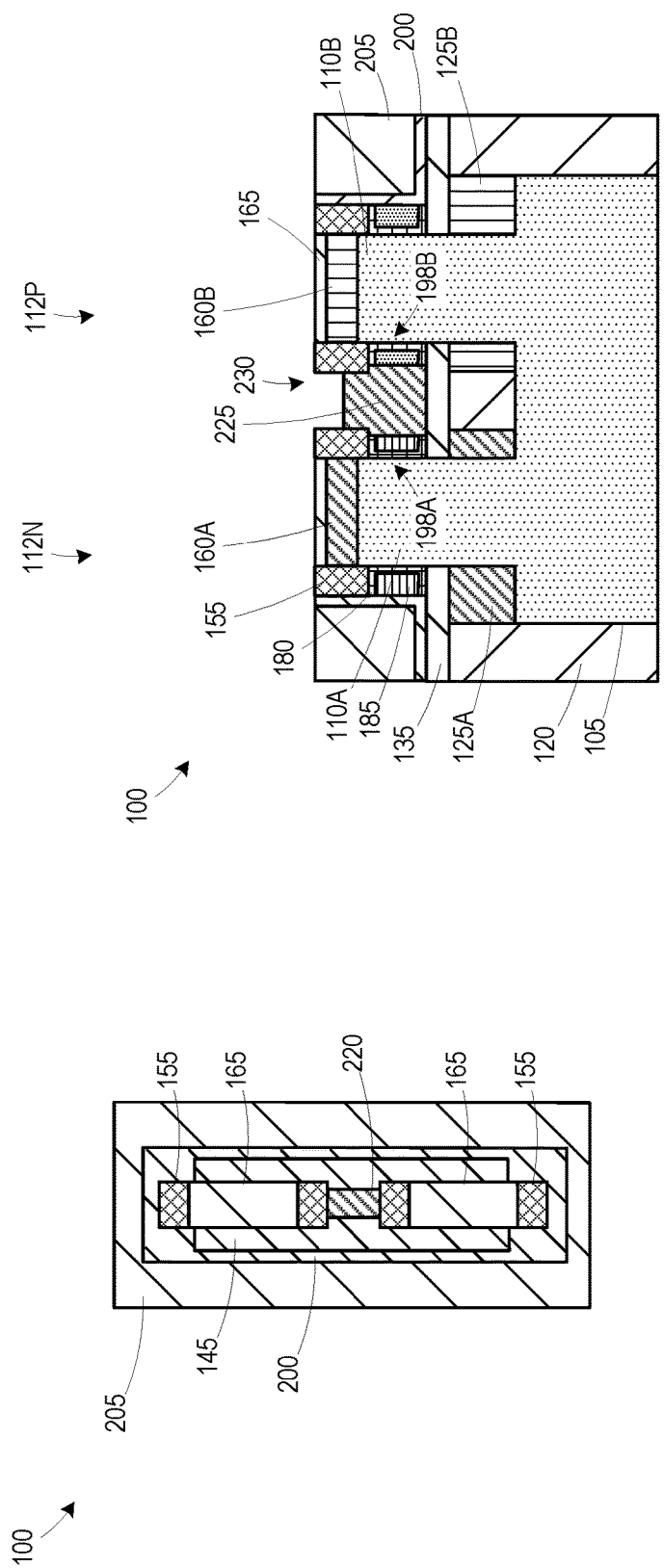

FIG. 20 illustrates the product 100 after an optional etch process was performed to recess the gate plug 225 to define a cavity 230.

FIG. 21 illustrates a top view of the product 100 after an etch process was performed to remove remaining portions of the ring spacers 145, thereby exposing the underlying bottom spacer 135 and defining a spacer cavity 235.

FIG. 22 illustrates the product 100 after a first deposition process was performed to form a liner layer 240 (e.g., low-k dielectric) in the cavities 230, 235 and a second deposition process was performed to form a dielectric layer 245 above the liner layer 240. A planarization process was performed to planarize the dielectric layer 245.

The use of the ring spacers 145 as described herein allows the fabrication of the replacement gate structures 198A, 198B to be performed independently, allowing the device characteristics, such as threshold voltage, to be independently controlled. Although the device 100 is illustrated as having a P-type transistor 112P adjacent an N-type transistor 112N with a shared gate configuration, the use of the ring spacer 145 to provide replacement gate flexibility may be provided for any type of device. Moreover, the shared gate configuration is also optional. The gate plug 225 may be constructed to contact only one of the replacement gate structures 198A, 198B. The process is not limited to just providing different gate materials for two different replacement gate structures 198A, 198B. The selective masking and iterative deposition and removal steps may be repeated for any number of replacement gate structures.

Additional process steps may be performed to complete the fabrication of the device 100. For example, additional contacts may be formed to contact the bottom source/drain regions 125A, 125B, the top source/drain regions 160A, 160B, the gate plug 225, etc.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
   forming first and second vertical semiconductor structures;
   forming first and second sacrificial spacers adjacent channel regions of the first and second vertical semiconductor structures, respectively;
   forming a ring spacer adjacent the first and second sacrificial spacers;
   removing end portions of the ring spacer to expose end portions of the first and second sacrificial spacers;
   replacing the first sacrificial spacer with a first replacement gate structure including a first gate insulation layer and a first conductive gate material;
   replacing the second sacrificial spacer with a second replacement gate structure including a second gate insulation layer and a second conductive gate material;
   removing remaining portions of the ring spacer to define a spacer cavity; and
   forming a dielectric material in the spacer cavity.

2. The method of claim 1, further comprising:
   forming a first bottom source/drain region adjacent the first vertical semiconductor structure;
   forming a second bottom source/drain region adjacent the second vertical semiconductor structure;
   forming a bottom spacer above the first and second bottom source/drain regions,; and
   forming the first and second sacrificial spacers above the bottom spacer.

3. The method of claim 1, wherein replacing the first sacrificial spacer with the first replacement gate structure comprises:
   removing the first sacrificial spacer to define a first gate cavity;
   forming the first gate insulation layer in the first gate cavity; and
   forming the first conductive gate material in the first gate cavity.

4. The method of claim 3, wherein replacing the second sacrificial spacer with the second replacement gate structure comprises:
   removing the second sacrificial spacer to define a second gate cavity, wherein the second sacrificial spacer is removed concurrently with removing the first sacrificial spacer;
   forming a gate insulation material layer in the first and second gate cavities to define the first and second gate insulation layers;
   forming the first conductive material in the first and second gate cavities; and
   selectively removing at least a portion of the first conductive gate material from the second gate cavity prior to forming the second conductive material in the second gate cavity.

5. The method of claim 4, wherein selectively removing at least a portion of the first conductive gate material from the second gate cavity further comprises:
   forming a mask layer covering the first gate cavity;
   performing an etch process to selectively remove at least a portion of the first conductive gate material from the second gate cavity in the presence of the mask layer; and removing the mask layer.

6. The method of claim 1, wherein a hard mask layer is positioned on a top surface of the first and second vertical semiconductor structures, and the method further comprises:
   removing the hard mask layer to define cap cavities;
   forming first and second top source/drain regions on the top surfaces of the first and second vertical semiconductor structures, respectively; and
   forming a cap layer above the first and second top source/drain regions.

7. The method of claim 6, further comprising:
   prior to forming first and second top source/drain regions, recessing the first and second sacrificial spacers; and
   forming inner spacers in the cap cavities above the recessed first and second sacrificial spacers.

8. The method of claim 1, further comprising:
   removing an inner portion of the ring spacer positioned between the first and second vertical semiconductor structures to define a contact cavity exposing the first and second gate insulation layers adjacent the first and second conductive gate materials, respectively;
   removing portions of the first and second gate insulation layers exposed in the contact cavity to expose the first conductive gate material and the second conductive gate material; and
   forming a conductive gate plug in the contact cavity.

9. The method of claim 8, further comprising:
   recessing the conductive gate plug prior to removing the remaining portions of the ring spacer; and
   forming the dielectric material in the spacer cavity and above the conductive gate plug.

10. The method of claim 1, wherein the first conductive gate material comprises a first work function material layer and the second conductive gate material comprises a second work function material layer different than the first work function material layer.

11. The method of claim 10, wherein one or both of the first and second work function material layers comprises a stack of layers.

12. The method of claim 1, wherein replacing the first and second sacrificial spacers comprises removing the first and second sacrificial spacers through the exposed end portions of the first and second sacrificial spacers.

13. A method, comprising:
    forming a first vertical semiconductor structure having a first bottom source/drain region;
    forming a second vertical semiconductor structure having a second bottom source/drain region;
    forming a bottom spacer above the first and second bottom source/drain regions;
    forming first and second sacrificial spacers on sidewalls of the first and second vertical semiconductor structures, respectively;
    forming a ring spacer adjacent the first and second sacrificial spacers;

removing end portions of the ring spacer to expose end portions of the first and second sacrificial spacers;

removing the first and second sacrificial spacers through the exposed end portions of the first and second sacrificial spacers to define a first gate cavity adjacent the first vertical semiconductor structure and a second gate cavity adjacent the second vertical semiconductor structure;

forming a gate insulation layer in the first and second gate cavities;

forming a first conductive gate material in the first and second gate cavities;

selectively removing at least a portion of the first conductive gate material from the second gate cavity;

forming a second conductive material in the second gate cavity;

removing remaining portions of the ring spacer to define a spacer cavity; and forming a dielectric material in the spacer cavity.

14. The method of claim 13, wherein the first conductive gate material comprises a first work function material layer and the second conductive gate material comprises a second work function material layer different than the first work function material layer.

15. The method of claim 13, wherein a hard mask layer is positioned on a top surface of the first and second vertical semiconductor structures, and the method further comprises:
removing the hard mask layer to define cap cavities;
forming first and second top source/drain regions on the top surfaces of the first and second vertical semiconductor structures, respectively; and
forming a cap layer above the first and second top source/drain regions.

16. The method of claim 15, further comprising:
prior to forming the first and second top source/drain regions, recessing the first and second sacrificial spacers; and
forming inner spacers in the cap cavities above the recessed first and second sacrificial spacers.

17. The method of claim 13, wherein selectively removing at least a portion of the first conductive gate material from the second gate cavity further comprises:
forming a mask layer covering the first gate cavity;
performing an etch process to selectively remove at least a portion of the first conductive gate material in the presence of the mask layer; and
removing the mask layer.

18. The method of claim 13, further comprising:
removing an inner portion of the ring spacer positioned between the first and second vertical semiconductor structures to define a contact cavity exposing the gate insulation layer adjacent the first conductive gate material and the second conductive gate material;
removing portions of the gate insulation layer exposed in the contact cavity to expose the first conductive gate material and the second conductive gate material; and
forming a conductive gate plug in the contact cavity.

19. The method of claim 18, further comprising:
recessing the conductive gate plug prior to removing the remaining portions of the ring spacer; and
forming the dielectric material in the spacer cavity and above the conductive gate plug.

20. The method of claim 13, further comprising forming a dielectric liner layer covering exposed portions of the first and second conductive gate materials.

* * * * *